Aug. 4, 1970 B. PETERSEN 3,522,519

ELECTRONIC CHOPPER UTILIZING A FIELD EFFECT TRANSISTOR SWITCH

Filed July 10, 1967 2 Sheets-Sheet 1

Berthus Petersen,
INVENTOR.
BY.

GOLOVE & KLEINBERG,
ATTORNEYS.

Berthus Petersen,
INVENTOR.
BY.

GOLOVE & KLEINBERG,
ATTORNEYS.

3,522,519
ELECTRONIC CHOPPER UTILIZING A FIELD EFFECT TRANSISTOR SWITCH

Berthus Petersen, Delft, Netherlands, assignor to N.V. v/h P. J. Kipp & Zonen, Delft, Netherlands Filed July 10, 1967, Ser. No. 652,254
Claims priority, application Netherlands, July 13, 1966, 6609879
Int. Cl. H02m 7/44; H03f 3/16; H03b 17/00
U.S. Cl. 321—44 4 Claims

ABSTRACT OF THE DISCLOSURE

An electronic chopper is disclosed utilizing a field effect transistor as the switch to convert DC-to-AC by interrupting current in the primary of a transformer. Any leakage in the field effect transistor which would cause transients is compensated for by connecting an impedance in parallel with the primary to act as a short circuit for high frequency signal components. Alternative embodiments utilize other impedance elements in parallel with the primary to short circuit high frequency components. A circuit is shown which enables a pair of asymmetric field effect transistors to function as a single, symmetric field effect transistor in the present invention.

The disclosure relates to an electronic chopper for converting a direct input voltage into an alternating output voltage, in which a coil in series with the source and the drain of a field effect transistor is connected to the input terminals, the coil being coupled with an output coil connected to the output terminals, whilst the gate of the field effect transistor is connected to a square wave generator which renders the field effect transistor alternately conducting and non-conducting.

In such an electronic chopper, interfering signals arise because the gate is not completely isolated electrically from the source and the drain. The undesired coupling between the gate and the two other electrodes is caused in part by internal capacities and in part by leakage currents.

The invention aims at providing an electronic chopper of the type as described, in which the interfering signals are substantially suppressed, without resorting to selected, individuals field effect transistors.

For that purpose, it is a feature of an electronic chopper according to the invention, that the coil consists of two similar halves, each of which with one end being connected to the source and drain respectively of the symmetric field effect transistor, the other ends being connected with each other through a capacitor.

In this embodiment, the interfering signals arising by capacitive causes, cancel in the output coil.

Although symmetric field effect transistors are available, it is also possible to use asymmetric field effect transistors. If the gates of two asymmetric field effect transistors are connected with each other and if the source of the one field effect transistor is connected to the drain of the other field effect transistor and vice versa, the pair of thus connected asymmetric field effect transistors can be used as a single symmetric field effect transistor.

For suppressing the interfering signals arising by leakage currents of the gate, the square wave generator can be connected between the gate of the the field effect transistor and the mid tap of a voltage divider between the ends of the coil halves which are not connected to the electrodes of the field effect transistor. In that case it is advantageous, to have the voltage divider include two equal capacitors connected in series, which together form the capacitor between the ends of the coil halves which are not connected to the electrodes of the field effect transistor.

If desired, the device as described can be doubled, in which case two circuits, each consisting of a field effect transistor with two coil halves, are connected parallel in the input circuit, the gates of the two field effect transistors being driven with opposite polarity, whilst the coils of both field effect transistors are coupled with a common output coil and the coil terminals which are not connected with electrodes of the field effect transistors, are connected to a common capacitor.

The invention is further elucidated below with reference to the drawing, which shows a few embodiments of a device according to the invention.

Figure 1:
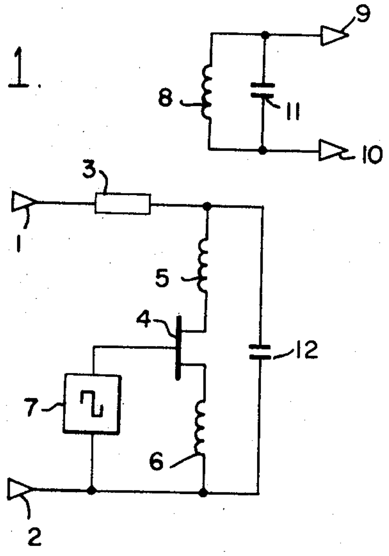
FIG. 1 is a circuit diagram of a first embodiment of an electronic chopper according to the invention.

In FIG. 1, the direct input voltage is connected to the input terminals 1 and 2 and is applied through a series resistor 3 (possibly the internal resistance of the voltage source) to a field effect transistor 4, in the source lead and drain lead of which, equal coil halves 5 and 6, respectively, are connected. The field effect transistor 4 is alternately rendered conducting and non-conducting by a square wave generator 7 connected to its gate, whereby an intermittent direct current flows through the coil halves 5 and 6, the magnitude of this current being determined by the magnitude of the direct input voltage at the terminals 1 and 2. The coil halves 5 and 6 are coupled with an output coil 8 connected to the output terminals 9 and 10 and the polarity of the coil halves 5 and 6 is so chosen, that the intermittent direct currents through these coil halves are added in the output coil 8, so that an alternaing voltage is generated therein. For obtaining a favourable signal/noise ratio, the output coil 8 is tuned to the repetition frequency of the square wave provided by the square wave generator 7 by means of a capacitor 11. Due to internal capacities of the field effect transistor 4, during the edges of the square wave provided by the square wave generator 7, interferring signals are passed to the coil halves 5 and 6. Since the ends of these coil halves which are not connected with the electrodes of the field effect transistor 4, are connected with each other through a capacitor 12 which short-circuits the high frequency components concerned, these interfering signals pass in opposite directions through the two coil halves 5 and 6, so that they cannot generate an interferring signal in the output coil 8. In this way, the interferring output signals caused by internal capacities can be suppressed with a factor between 20 and 25 when using a symmetric field effect transistor.

Figure 2:
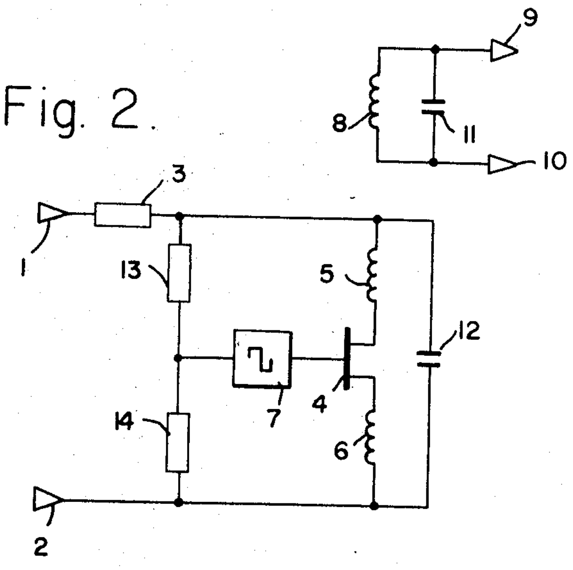
FIG. 2 is a circuit diagram of a second embodiment of an electronic chopper according to the invention.

FIG. 2 shows another embodiment which is largely similar to the embodiment of FIG. 1, so that corresponding components have been indicated with the same reference numerals as in FIG. 1. In this embodiment, the square wave generator 7 is connected between the gate of the field effect transistor 4 and the mid tap of a voltage divider comprising equal impedances 13 and 14, which is connected to those terminals of the coil halves 5 and 6 which are not connected to electrodes of the field effect transistor 4. The impedances 13 and 14 can consist of equal resistors or of equal impedances of a different kind, provided that these constitute no short-circuit for the direct input voltage which is applied to the series resistor 3. If the impedances 13 and 14 consist of equal capacitors, these can be chosen in such a way, that the capacitor 12 can be left out, whereby a simplification of the circuit is made possible. In this embodiment, the leakage currents which during the constant amplitude parts of the square wave generated by the square wave generator 7, occur due to the imperfect insulation of the gate electrode of the field effect transistor 4, also pass in opposite direction through the coil halves 5 and 6, so that these leakage currents too cannot cause an interfering output signal in the output coil 8. As in the embodiment of FIG. 1, a symmetric field effect transistor 4 should be used in this case.

Figure 3:
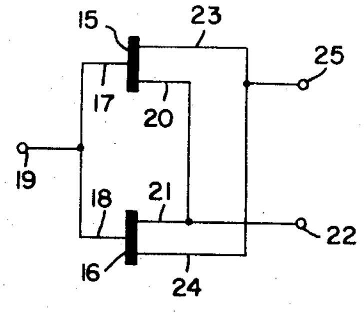
FIG. 3 is a circuit diagram of the way in which two asymmetric field effect transistors can be connected as a single symmetric field effect transistor.

Even though such symmetric field effect transistors are available, it is sometimes preferred to make use of asymmetric field effect transistors. In that case, two asymmetric field transistors can be connected as a single symmetric field effect transistor in accordance with FIG. 3. For that purpose, the gates 17 and 18 of two asymmetric field effect transistors 15 and 16 are interconnected and these together form a single gate terminal 19. Further, the source 20 of the field effect transistor 15 is connected to the drain 21 of the field effect transistor 16, which two electrodes together form a source terminal 22. Moreover, the drain 23 of the field effect transistor 15 is connected to the source 24 of the field effect transistor 16, which two electrodes together form a drain terminal 25. The assembly behaves like a completely symmetric single field effect transistor.

Figure 4:
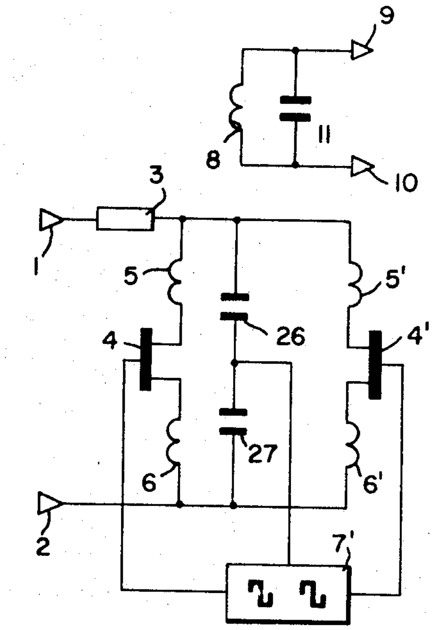
FIG. 4 is a circuit diagram of a third embodiment of an electronic chopper according to the invention.

If desired, a device as described hereinabove can be doubled, in which the direct input current is alternately passed through two equal branches in which coils are connected. Such an embodiment is shown in FIG. 4, in which corresponding components have been indicated with the same reference numerals. Besides the field effect transistor 4 with coil halves 5 and 6, a second field effect transistor 4' with coil halves 5' and 6' is made use of, whilst between coil terminals which are not connected with field effect transistor electrodes, a capacitive voltage divider comprising equal capacitors 26 and 27 is connected. The mid tap of this capacitive voltage divider is connected to the common terminal of a push-pull square wave generator 7' which provides square waves of opposite polarity to the gate electrodes of the field effect transistors 4 and 4', whereby these field effect transistors are alternately rendered conducting and non-conducting.

I claim:

1. Electronic chopper for converting a direct input voltage into an alternating output voltage, comprising:

symmetric field effect transistor means including two parallel connected asymmetric field effect transistors, the gates of which are interconnected, the source of a one field effect transistor being connected to the drain of the other field effect transistor and vice versa;

a coil, in series with the source and the drain of said field effect transistor means, connected to the input terminal, said coil being coupled with an output coil connected to the output terminal;

the gate of said field effect transistor means, adapted to be connected to a square wave generator rendering said field effect transistor means alternately conducting and non-conducting;

said coil consisting of two equal halves, each of which is, at one end, connected to the source and drain, respectively, of said symmetric field effect transistor means, the other ends being interconnected through a capacitor.

2. Electronic chopper according to claim 1, wherein the square wave generator is connected between the gate of said field effect transistor means and the mid tap of a voltage divider between the ends of the coil halves which are not connected to field effect transistor electrodes.

3. Electronic chopper, according to claim 2, wherein the voltage divider comprises two series-connected equal capacitors, which together form the capacitor between the ends of the coil halves which are not connected to field effect transistor electrodes.

4. Electronic chopper according to claim 1, wherein the input circuit in series with the resistor comprises two parallel circuits, each comprising a field effect transistor with two coil halves, the gates of the two field effect transistors being driven with opposite polarity, whilst the coils of the two field effect transistors are coupled with a common output coil and the coil terminals which are not connected with field effect transistor electrodes, being connected to a common capacitor.

References Cited

UNITED STATES PATENTS 3,397,353 8/1968 Hitt et al. -------- 307—251 X
3,406,327 10/1968 Mapham et al. ------- 321—45

LEE T. HIX, Primary Examiner

W. H. BEHA, Jr., Assistant Examiner

U.S. Cl. X.R.

307—240, 251; 330—9